(12) United States Patent
Dedic

(10) Patent No.: US 6,628,219 B2
(45) Date of Patent: Sep. 30, 2003

(54) REDUCING JITTER IN MIXED-SIGNAL INTEGRATED CIRCUIT DEVICES

(75) Inventor: Ian Juso Dedic, Northolt (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/987,279

(22) Filed: Nov. 14, 2001

(65) Prior Publication Data

US 2002/0163456 A1 Nov. 7, 2002

(30) Foreign Application Priority Data

Mar. 21, 2001 (GB) .............................. 0107119

(51) Int. Cl.$^7$ ................................ H03M 1/00
(52) U.S. Cl. .................. 341/144; 341/155; 323/269
(58) Field of Search ................. 341/122, 144, 341/155; 323/267, 269–272

(56) References Cited

U.S. PATENT DOCUMENTS

| | | | | |
|---|---|---|---|---|
| 5,959,502 A | * | 9/1999 | Ovens et al. .................. | 331/8 |
| 6,163,283 A | | 12/2000 | Schofield | |
| 6,218,974 B1 | | 4/2001 | Dedic | |

FOREIGN PATENT DOCUMENTS

| GB | 2 270 431 A | 3/1994 |
|---|---|---|
| GB | 2 335 097 A | 9/1999 |
| GB | 2 341 287 A | 3/2000 |
| GB | 2 356 267 A | 5/2001 |
| GB | 2 356 750 A | 5/2001 |

* cited by examiner

Primary Examiner—Howard L. Williams
(74) Attorney, Agent, or Firm—Staas & Halsey LLP

(57) ABSTRACT

A mixed-signal integrated circuit device (100) such as a digital-to-analog converter comprises signal processing circuitry (120–170) operable to produce an output signal (OUT) in dependence upon a received input signal (D1–Dm). Production of the output signal (OUT) is initiated at a time determined by a timing signal (CLK) and is completed at a time which is delayed by a delay time with respect to said timing signal (CLK). The signal processing circuitry (120–170) comprises at least one delay-contributing portion (120, 130, 150, 160) which makes a contribution to the delay time that is affected by variations in a power supply voltage (VDD) applied to the delay-contributing portion concerned. The integrated circuit device (100) is provided with at least one internal supply voltage regulator (110) for connection when the device is in use to a power source external of the device (100) to receive therefrom an external power source voltage (VDD). The supply voltage regulator (110) derives a regulated internal power supply voltage (VDD(REG)) from the external power source voltage (VDD), and this regulated internal power supply voltage (VDD(REG)) is applied to one of the delay-contributing portions (130, 150, 160). At least one further circuitry portion (140, 170) within the integrated circuit device (100) is powered by a supply voltage (VDD) other than the regulated internal power supply voltage (VDD (REG)).

29 Claims, 10 Drawing Sheets

| BINARY INPUT WORD | | | THERMOMETER-CODED SIGNALS | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

REDUCING JITTER IN MIXED-SIGNAL INTEGRATED CIRCUIT DEVICES

BACKGROUND OF THE INVENTION

1. Field of the Invention

The present invention relates to reducing jitter in mixed-signal integrated circuit devices, for example in digital-to-analog converters (DACs). Such integrated circuit devices include a mixture of digital circuitry and analog circuitry.

2. Description of the Related Art

FIG. 1 of the accompanying drawings shows parts of a conventional DAC of the so-called "current-steering" type. The DAC 1 is designed to convert an m-bit digital input word (D1–Dm) into a corresponding analog output signal.

The DAC 1 contains analog circuitry including a plurality (n) of identical current sources $2_1$ to $2_n$, where $n=2^m-1$. Each current source 2 passes a substantially constant current I. The analog circuitry further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by digital circuitry including a binary-thermometer decoder 6. The decoder 6 operates as follows.

When the binary input word D1–Dm has the lowest value the thermometer-coded signals T1–Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$.

As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n-i differential switching circuits $4_{i+1}$ to $4_n$ select their respective second terminals. The analog output signal $V_A-V_B$ is equal to $(2i-n)IR$.

FIG. 2 of the accompanying drawings shows an example of the thermometer-coded signals generated for a three-bit binary input word D1–D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr-1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

However, when it is desired to operate such a DAC at very high speeds (for example 100 MHz or more), it is found that glitches may occur at one or both of the first and second connection lines A and B, producing a momentary error in the DAC analog output signal $V_A-V_B$. These glitches in the analog output signal may be code-dependent and result in harmonic distortion or even non-harmonic spurs in the output spectrum. Some causes of these glitches are summarised as follows.

The digital circuitry (the binary-thermometer decoder 6 and other digital circuits) is required to switch very quickly and its gate count is quite high. Accordingly, the current consumption of the digital circuitry could be as much as 20 mA per 100 MHz at high operating speeds. This combination of fast switching and high current consumption inevitably introduces a high degree of noise into the power supply lines. Although it has previously been considered to separate the power supplies for the analog circuitry (e.g. the current sources $2_1$ to $2_n$ and differential switching circuits $4_1$ to $4_n$ in FIG. 1) from the power supplies for the digital circuitry, this measure alone is not found to be wholly satisfactory when the highest performance levels are required. In particular, noise arising from the operation of the binary-thermometer decoder 6 can lead to skew in the timing of the changes in the thermometer-coded signals T1 to Tn in response to different changes in the digital input word D1 to Dm. For example, it is estimated that the skew may be several hundreds of picoseconds. This amount of skew causes significant degradation of the performance of the DAC and, moreover, being data-dependent, the degradation is difficult to predict.

In order to reduce the skew problem mentioned above, it has been considered to provide a set of latch circuits, corresponding respectively to the thermometer-coded signals T1 to Tn, between the digital circuitry and the analog circuitry, which latches are activated by a common timing signal such that the outputs thereof change simultaneously. However, it is found that this measure alone is not wholly effective in removing skew from the thermometer-coded signals. It is found, for example, that data-dependent jitter still remains at the outputs of the latch circuits and that the worst-case jitter increases in approximate proportion to the number of thermometer-coded signals. Thus, with (say) 64 thermometer-coded signals the worst-case jitter may be as much as 20 picoseconds which, when high performance is demanded, is excessively large.

Some of the above problems have been addressed in the assignee's U.S. Pat. No. 6,320,257 (corresponding to United Kingdom patent publication no. GB-A-2335097), the entire contents of which are incorporated herein by reference. In GB-A-2335097, a set of latches is provided between the digital and analog circuitry, each of the digital, latch and analog circuitry portions being provided with its own power supply terminals for connection to different off-chip power sources. GB-A-2335097 also discloses the use of a triple well construction and the use of shielding to reduce coupling between the power supplies of the different circuitry portions.

However, even when such techniques as described above are employed, it has been found by the present inventor that in the most demanding of applications, significant jitter still results from power supply variation caused by noise from various sources.

SUMMARY OF THE INVENTION

An embodiment of one aspect of the present invention provides a mixed-signal integrated circuit device comprising signal processing circuitry operable to produce an output signal in dependence upon a received input signal. Production of the output signal is initiated at a time determined by a timing signal and is completed at a time which is delayed by a delay time with respect to the timing signal. At least one delay-contributing portion makes a contribution to the delay time that is affected by variations in a power supply voltage applied to the delay-contributing portion concerned. At least one internal supply voltage regulator is connected when the device is in use to a power source external of the device to receive therefrom an external power source voltage. The regulator is operable to derive from the external power source voltage a regulated internal power supply voltage. This regulated internal power supply voltage is applied to the delay-contributing portion. At least one further circuitry portion within the device is powered by a supply voltage other than the regulated internal power supply voltage.

DETAILED DESCRIPTION OF THE PREFERRED EMBODIMENTS

Before a detailed description of embodiments of the present invention, further considerations relating to the problems mentioned above with regard to jitter caused by power supply variation will first be discussed.

For circuits in which delay is a function of supply voltage and which are required to exhibit very low jitter characteristics, very low-noise power supplies are required. This is particularly true for CMOS circuits, where the delay is, approximately proportional to the square root of the supply voltage, which operate at high frequencies with low jitter (for example, high-speed ADCs and DACs) and where the delay from clock to output is not very small (for example, in a case where the clock signal is distributed through a tree-form circuit which results in delays).

Figures 1, 2:
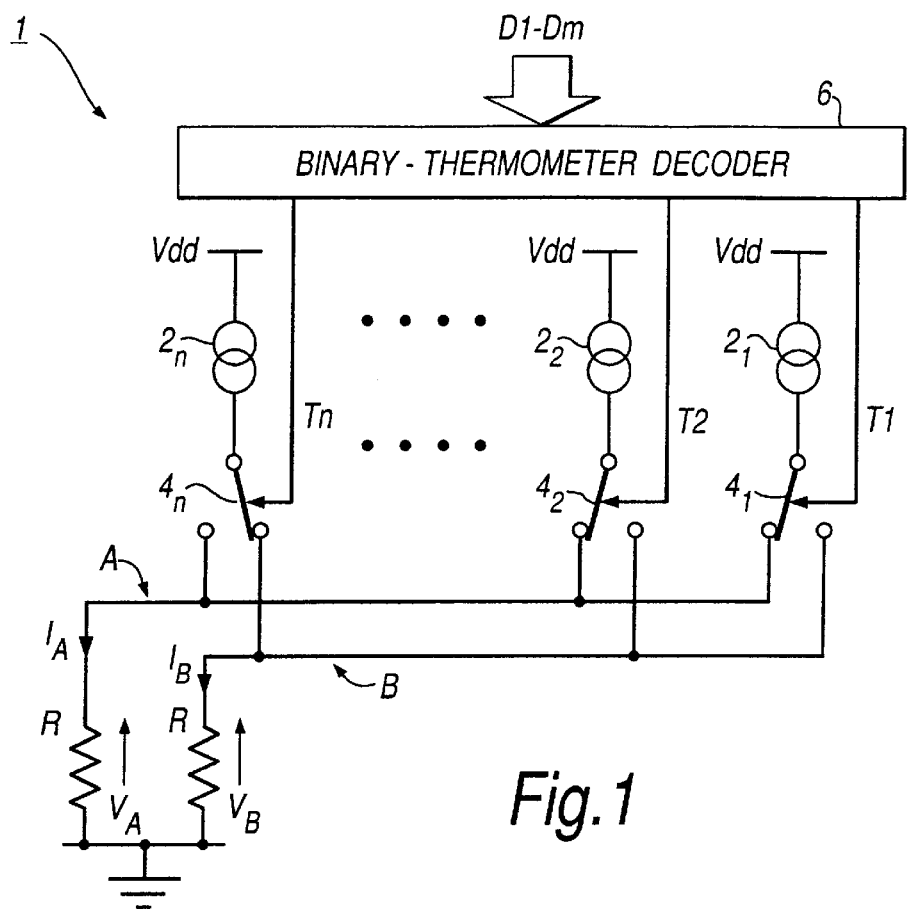
FIG. 1, discussed hereinbefore, shows parts of a conventional DAC.
FIG. 2, also discussed hereinbefore, presents a table showing thermometer-coded signals derived from a binary input word.

For example, consider the case of a DAC producing as its analog output signal a sinewave having an amplitude of 1 V and a frequency $F_{out}$ of 100 MHz, the DAC having a 1 ns total delay from its clock input to its differential switch circuits (4 in FIG. 1). Such an output signal has a maximum slew rate of $2\Pi(F_{out})$, or 0.63 V/ns. Assuming that the delay D is proportional to the square root of the supply voltage V, a change in the supply voltage of 1% will alter the delay by 0.5% (since $D=aV^{1/2}$, so $dD=\frac{1}{2}aV^{-1/2}dV=\frac{1}{2}aV^{1/2}dV/V$, so $dD/D=\frac{1}{2}dV/V$). The delay is therefore altered by 5 ps by this 1% change in the supply voltage. At a slew rate of 0.63 V/ns this will give an error of 3.1 mV in the amplitude of the analog output signal, or about −50 dBc (i.e. −50 dB relative to the main signal).

A sinewave ripple on the supply at a frequency of $F_s$ will cause sidebands at $F_{out} \pm F_s$, which leads to a degradation in the spurious-free dynamic range (SFDR). For a target SFDR of 90 dBc, ripple on the supply must not exceed 0.01%, which is very difficult to achieve in previously-considered DACs given that noise is coupled onto the supply from various sources. Although it is usually recommended to provide clean low-noise supplies, even this may not be sufficient in such a case where supply voltage variation is so critical.

Figure 3:
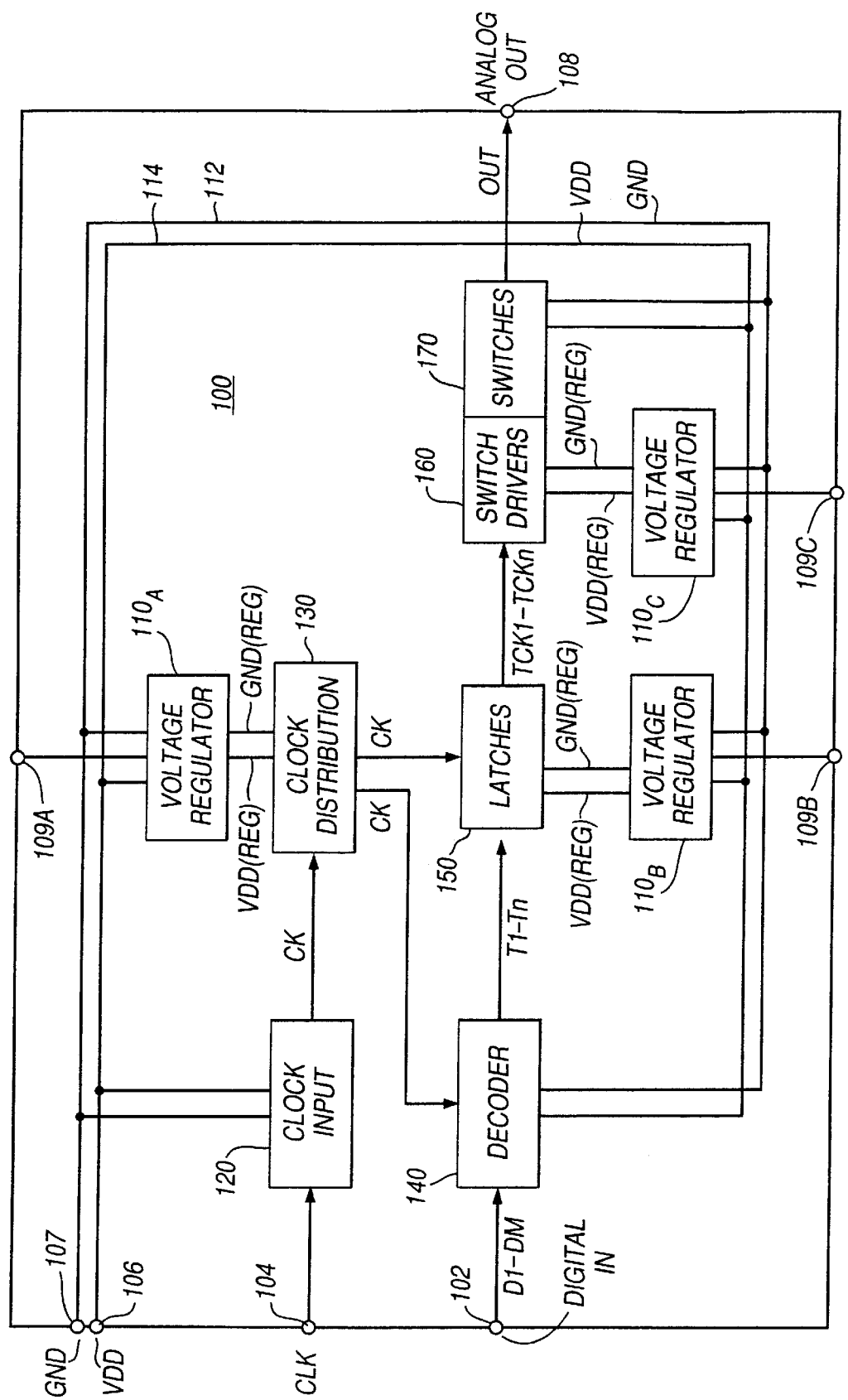
FIG. 3 is a block diagram showing parts of an mixed-signal integrated circuit device (DAC) embodying the present invention.

FIG. 3 shows parts of a mixed-signal integrated circuit device 100 embodying the present invention. The mixed-signal integrated circuit device 100 in this embodiment is a digital-to-analog converter (DAC) comprising an input 102 for receiving a digital binary input word D1–Dm (input signal), a clock input 104 for receiving a clock (timing) signal CLK, and an output 108 for outputting an analog output signal OUT.

The DAC 100 also comprises a plurality of signal processing circuitry portions as follows: clock input circuitry 120, clock distribution circuitry 130, decoder circuitry 140, latch circuitry 150, switch driver circuitry 160 and switch circuitry 170. The DAC 100 also comprises a supply voltage terminal 106 for receiving a supply voltage VDD which is used to power each of the signal processing circuitry portions 120 to 170, and a ground (GND) terminal 107.

In this embodiment, the clock distribution circuitry 130, the latch circuitry 150 and the switch driver circuitry 160 are also provided respectively with their own on-chip supply voltage regulators $110_A$, $110_B$ and $110_C$ for regulating the external power source voltage applied to the VDD and GND terminals, as will be described in more detail below. Each regulator has a corresponding connection-terminal 109A to 109C, as described later.

The DAC 100 is operable to perform a series of operation cycles (conversion cycles) at a predetermined operating frequency (sampling rate) $F_{DAC}$. $F_{DAC}$ is, for example, 100 million samples per second (100 Msamples/s).

The clock input circuitry 120 of FIG. 3 receives at its input the timing clock signal CLK and outputs a modified clock signal CK derived from the timing clock signal CLK. The clock input circuitry 120 may comprise clock buffering circuitry and/or circuitry for cleaning up the received clock signal CLK, for example for ensuring that a substantially 50% duty cycle clock CK is output from the clock input circuitry 120. Circuitry suitable for providing a substantially 50% duty cycle clock is described in the assignee's U.S. Pat. No. 6,218,974 (corresponding to United Kingdom patent publication no. GB-A-2356301), the entire content of which is herein incorporated by reference. Alternatively, or in addition, the clock input circuitry 120 may comprise frequency multiplying or dividing circuitry for providing as the modified clock signal CK a signal of higher or lower frequency than the received clock signal CLK.

The clock distribution circuitry 130 of FIG. 3 may comprise a fanning-out arrangement and further clock buffering circuitry for distribution of the on-chip clock signal OK to various parts of the integrated circuit device (for example the decoder circuitry 140 and the latch circuitry 150 of FIG. 3). An example of clock distribution circuitry is described in the assignee's United Kingdom patent publication no. GB-A-2356750 (see for example, FIG. 10), the entire contents of which are herein incorporated by reference.

Figure 4:
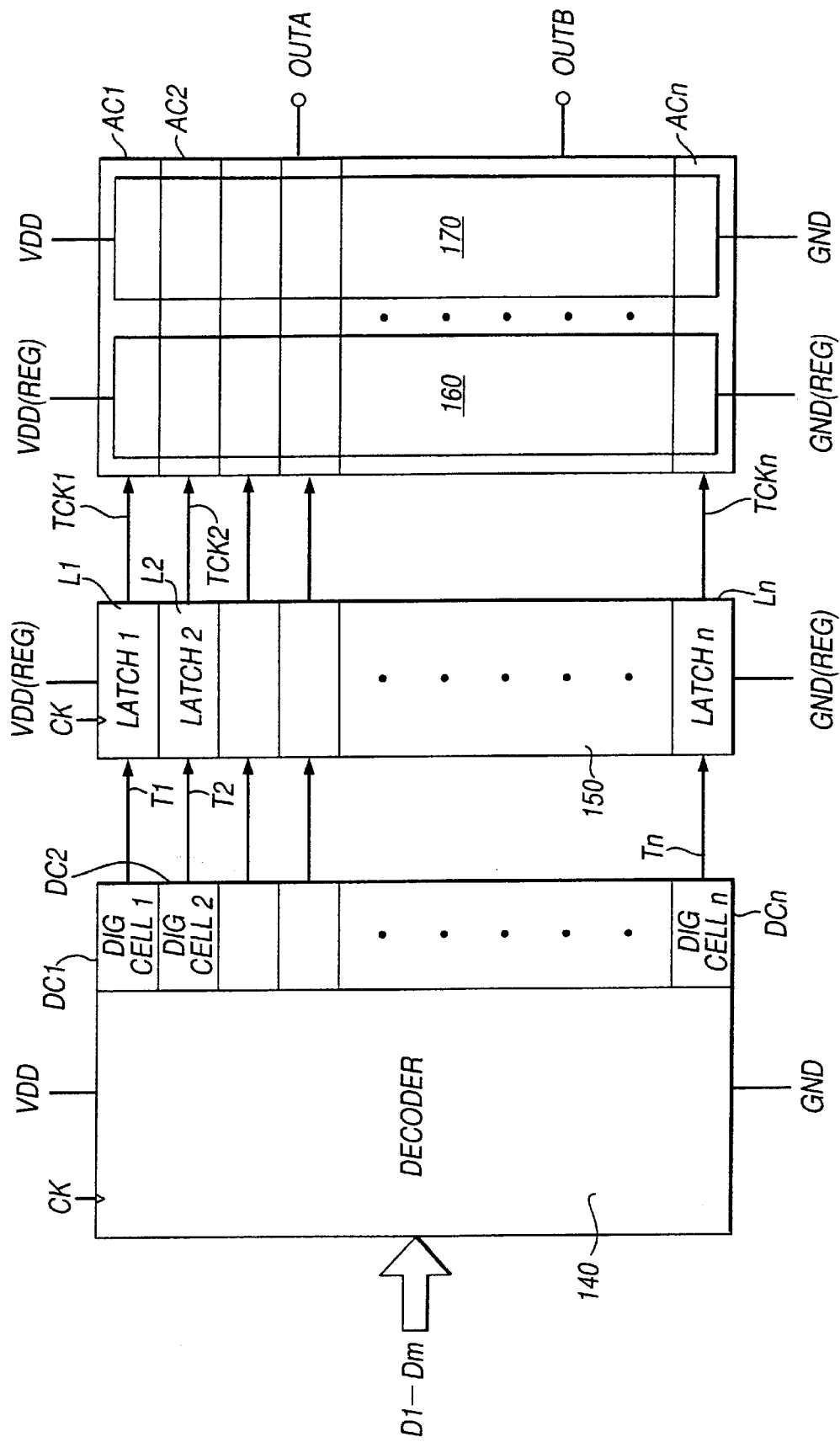
FIG. 4 is a block diagram showing parts of the FIG. 3 DAC in more detail.

FIG. 4 shows further parts of the FIG. 3 circuitry in more detail. The decoder circuitry 140 is connected to receive the above-mentioned m-bit digital input word D1–Dm. In this embodiment, the decoder circuitry 140 has an output stage made up of n digital circuits DC1 to DCn which produce respectively thermometer-coded signals T1 to Tn based on the digital input word, for example in accordance with the table of FIG. 2 discussed hereinbefore. The latch circuitry 150 comprises a set of n latch circuits L1 to Ln. Each latch circuit is connected to receive an individually-corresponding one of the thermometer-coded signals T1 to Tn produced by the decoder circuitry 140. Each latch circuit L1 to Ln also receives the clock signal CK. The latch circuits L1 to Ln produce at their outputs respective clocked thermometer signals TCK1 to TCKn that correspond respectively to the thermometer-coded signals T1 to Tn produced by the decoder circuitry 140. The decoder circuitry 140 can optionally be provided with a set, of input and/or output latches also clocked by the clock signal CK.

The switch driver circuitry 160 and switch circuitry 170 together comprise a set of n analog circuits AC1 to ACn. Each of the analog circuits AC1 to ACn comprises a switch driver and a switch as explained further below with reference to FIG. 6, and receives an individually-corresponding one of the clocked thermometer signals TCK1 to TCKn. The analog circuits AC1 to ACn each have one or more analog output terminals and signals produced at the analog output terminals are combined appropriately to produce one or more analog output signals. For example, currents may be summed by summing connection lines as in FIG. 1. Two such analog output signals OUTA and OUTB are shown in FIG. 4 by way of example; these signals are represented schematically in FIG. 3 as the signal OUT delivered to the output terminal 108.

Figure 5:
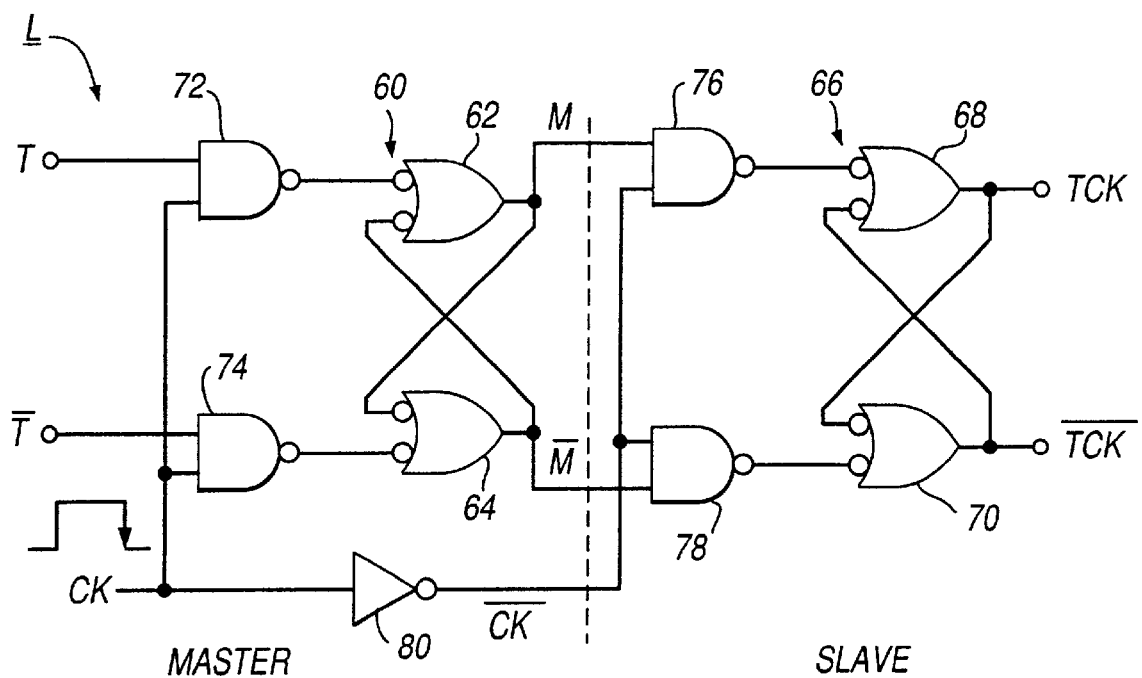
FIG. 5 is a circuit diagram showing an example construction of a latch of FIG. 4.
Figure 6:
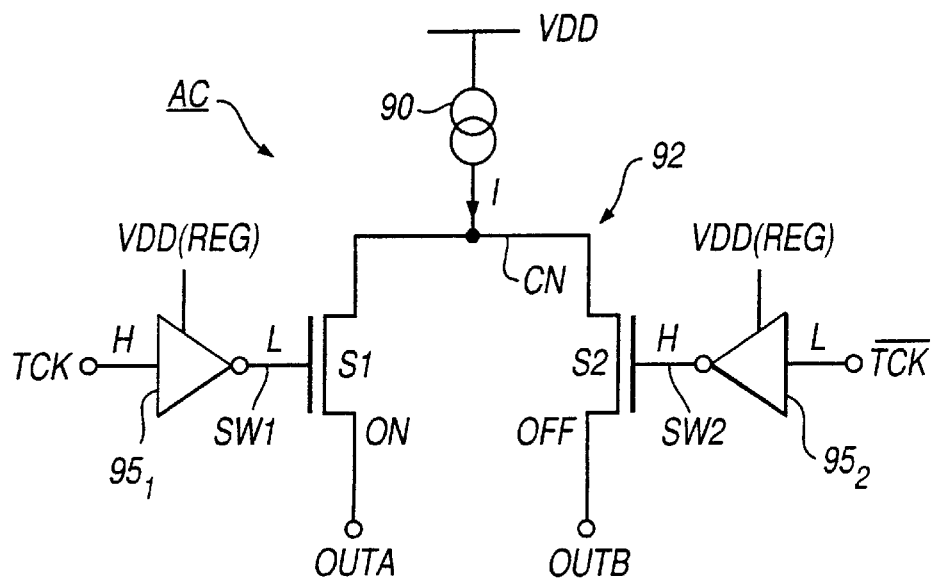
FIG. 6 is a circuit diagram showing an example construction of an analog cell of FIG. 4.

FIGS. 5 and 6 show respectively examples of the construction of the latch circuit L and analog circuit AC of one cell of the FIG. 4 circuitry.

The latch circuit L of FIG. 5 is of the differential D-type having (in this example) a master-slave configuration. The FIG. 5 circuit has a master flip-flop 60 made up of NAND gates 62 and 64, and a slave flip-flop 66 made up of NAND gates 68 and 70. NAND gates 72 and 74 each receive at one input thereof a clock signal CK (FIG. 4). The other inputs of the gates 72 and 74 are connected respectively to T and $\overline{T}$ inputs of the circuit. The T input receives the thermometer-coded signal T produced by the digital circuit DC of the cell concerned. The $\overline{T}$ input is connected to receive a signal $\overline{T}$ complementary to the thermometer-coded signal. Complementary signals T and $\overline{T}$ are used in this embodiment since any change in the signal T is accompanied by a complementary change in the signal $\overline{T}$, which reduces the noise imposed on the power supply lines when the input word changes. If desired, however, the FIG. 5 circuit could be modified to have a single T input, in which case an additional inverter (not shown) would be provided between that single input and the relevant input of the gate 74.

The FIG. 5 circuit also includes NAND gates 76 and 78 connected between outputs M and $\overline{M}$ of the master flip-flop 60 and inputs of the slave flip-flop 66. These gates 76 and 78 receive an inverted version $\overline{CK}$ of the clock signal CK produced by an inverter 80. Outputs of the slave flip-flop produce respectively mutually-complementary output signals TCK and $\overline{TCK}$.

In use of the FIG. 5 circuit, when the clock signal CK is high, the gates 72 and 74 are enabled, forcing the outputs M and $\overline{M}$ of the master flip-flop 60 to the same logic values as the inputs T and $\overline{T}$ respectively, i.e. M=T and $\overline{M}=\overline{T}$. The gates 76 and 78 are disabled, so the slave flip-flop 66 retains its previous state. When the clock signal CK changes from HIGH to LOW, the inputs to the master flip-flop 60 are disconnected from the T and $\overline{T}$ input signals, whereas the inputs of the slave flip-flop 66 are simultaneously coupled to the outputs M and $\overline{M}$ of the master flip-flop 60. The master flip-flop 60 accordingly transfers its state to the slave flip-flop 66. No further changes can occur in the output signals TCK and $\overline{TCK}$ because the master flip-flop 60 is now effectively disabled. At the next rising edge of the clock signal CK, the slave flip-flop 66 is decoupled from the master flip-flop 60 and retains its state, whilst the master flip-flop 60 once again follows the input signals T and $\overline{T}$.

FIG. 6 shows parts of an exemplary analog circuit AC of one cell of the FIG. 4 circuitry. The analog circuit AC comprises a constant-current source 90 and a differential switching circuit 92. The constant-current source 90 and a differential switching circuit 92 form part of the switch circuitry portion 170 shown in FIG. 3. The differential switching circuit 92 comprises first and second PMOS field-effect-transistors (FETs) S1 and S2. The respective sources of the transistors S1 and S2 are connected to a common node CN to which the current source 90 is also connected. The respective drains of the transistors S1 and S2 are connected to respective first and second summing output terminals OUTA and OUTB of the circuit. In this embodiment, the output terminals OUTA of all cells are connected together and the respective output terminals OUTB of the cells are connected together.

Each transistor S1 and S2 has a corresponding switch driver circuit $95_1$ and $95_2$ connected to its gate. The switch driver circuits $95_1$ and $95_2$ form part of the switch driver circuitry portion 160 of FIG. 3. The clocked thermometer signals TCK and $\overline{\text{TCK}}$ produced by the latch circuit L of the cell (e.g. FIG. 5) are applied respectively to inputs of the switch driver circuits $95_1$ and $95_2$. Each switch driver circuit buffers and inverts its received input signal TCK or $\overline{\text{TCK}}$ to produce a switching signal SW1 and SW2 for its associated transistor S1 or S2 such that, in the steady-state condition, one of the transistors S1 and S2 is on and the other is off. For example, as indicated in FIG. 2 itself, when the input signal TCK has the high level (H) and the input signal $\overline{\text{TCK}}$ has the low level (L), the switching signal SW1 (gate drive voltage) for the transistor S1 is at the low level L causing that transistor be ON, whereas the switching signal SW2 (gate drive voltage) for the transistor S2 is at the high level H, causing that transistor to be OFF. Thus, in this condition, all of the current I flowing into the common node CN is passed to the first output terminal OUTA and no current passes to the second output terminal OUTB.

When the input signals TCK and $\overline{\text{TCK}}$ undergo complementary changes from the state shown in FIG. 6, the transistor S1 turns OFF at the same time that the transistor S2 turns ON.

As far as the decoder circuitry 140 is concerned, any suitable binary-thermometer decoding circuitry can be used. A two-stage decoding process may be used in which a so-called global decoder decodes the input word into two or more sets (or dimensions) of thermometer-coded signals (referred to as row and column signals or row, column and depth signals). These two or more sets of signals are delivered to a plurality of local decoders which correspond respectively to the cells. Each local decoder only needs to receive and decode a small number (e.g. two or three) of the signals in the sets produced by the global decoder. These local decoders can be regarded as being arranged logically (not necessarily physically as well) in two or more dimensions corresponding respectively to the sets of thermometer-coded signals. The local decoders are addressed by the sets of the thermometer-coded signals and, using simple combinatorial logic, derive respective "local" thermometer-coded signals for their respective cells. The digital circuits DC1 to DCn in FIG. 4 may, for example, consist only of respective such local decoders, the global decoder being external to these digital circuits DC1 to DCn. Further details of two-stage thermometer-decoding may be found, for example, in the assignee's U.S. Pat. No. 6,163,283 (corresponding to United Kingdom patent publication no. GB-A-2333171) and an alternative decoding scheme also involving segment order rotation and morphing is described in the assignee's U.S. Pat. No. 6,496,129 corresponding to European patent publication no. EP-A-1202459, the entire contents of which are incorporated herein by reference.

Other features and modifications of the FIG. 4 circuitry are described in more detail in the assignee's U.S. Pat. No. 6,320,257 (corresponding to United Kingdom patent publication no. GB-A-2335097).

As described above, in each conversion cycle the signal processing circuitry portions 120 to 170 of the DAC 100 of FIG. 3 are together operable to produce the output signal OUT in dependence upon the received binary input word D1–Dm (input signal). Production of the output signal OUT is initiated at a time which is determined by the timing clock signal CLK received at the clock input 104 and is completed (i.e. available at the analog output terminal 108) at a time which is delayed with respect to the clock signal CLK. This time delay is referred to herein as the clock-to-sample (CTS) delay and will now be described with reference to the timing chart of FIG. 7.

Figure 7:
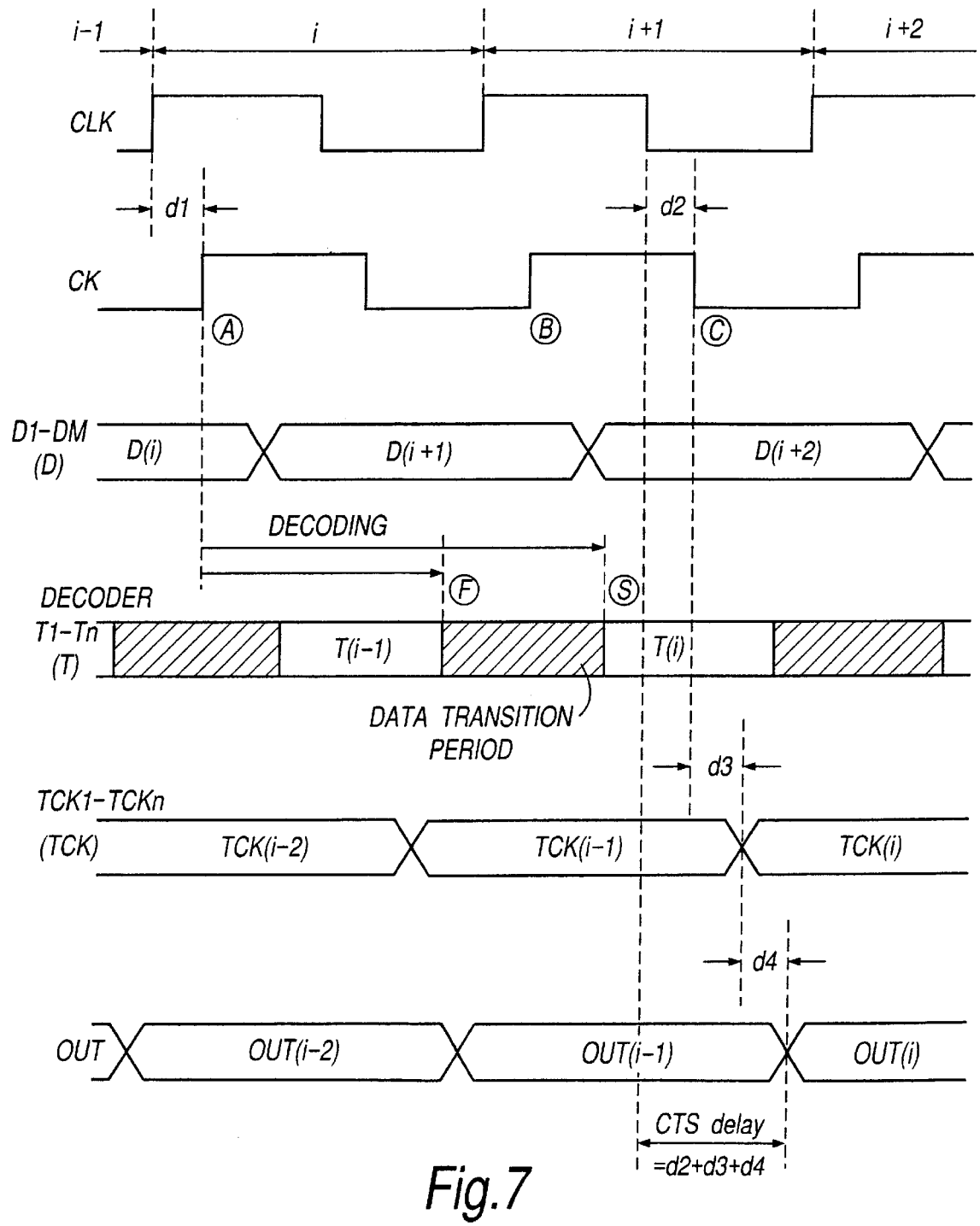
FIG. 7 is a timing chart for use in illustrating the clock-to-sample delay period.

The timing clock signal CLK received at the clock input 104 of the DAC 100 of FIG. 3 is shown at the top of FIG. 7. The DAC 100 operates based on successive cycles of the clock signal CLK. Each cycle commences at the rising edge of the CLK signal. This, as shown in FIG. 7, a cycle i–1 ends, and the next cycle i begins, at the first rising edge of the CLK signal in FIG. 7. Cycle i ends, and the next cycle i+1 begins, at the second rising edge of the CLK signal in FIG. 7.

The clock signal CLK is processed and buffered as described above by the clock input circuitry 120 and clock distribution circuitry 130 of FIG. 3 to produce the on-chip clock signal CK which is distributed to the decoder circuitry 140 and latch circuitry 150. This buffering, processing and distribution causes the rising edges of clock CK to be delayed by an amount d1 relative to the rising edges of the received clock CLK, and the falling edges of clock CK to be delayed by an amount d2 relative to the falling edges of the received clock CLK.

On each rising edge of clock CK, the decoder circuitry 140 begins a decoding operation to decode the digital input word D1–Dm present at the digital input terminal 102 at the rising edge concerned to produce the thermometer-coded signals T1–Tn. The decoding operation typically requires a processing time which is a high proportion of the clock period, and the results of each operation (i.e. the thermometer-coded signals T) may not be available in the same clock cycle as that in which the related input word was received. There is also inevitably some variation, or skew, between the times at which the decoder 140 has each of the n different thermometer coded signals T1–Tn ready. Thus, as shown in FIG. 7, it is only known that the T signals will change within a data transition period commencing at a time F when the fastest T signal is ready and ending at a time S when the slowest T signal is ready.

In the FIG. 7 example, the data input word D(i) present at the data input terminal 102 in FIG. 3 at the start of clock cycle i begins to be processed by the decoder circuitry 140 at rising edge A of the on-chip clock signal CK but the results of the processing are only guaranteed to be ready by the time S some way into the next clock cycle i+1. The results T(i–1) produced in cycle i in FIG. 7 relate to the data input word D(i–1) received in the clock cycle i–1. It can be seen that in this example the rising edge B of on-chip clock signal CK causes the decoder circuitry 140 to begin decoding data input word D(i+1) before the decoder has finished decoding data input word D(i), but this is possible since the decoder is of a pipelined type as described in the assignee's co-pending U.S. patent application Ser. No. 09/382459 (corresponding to United Kingdom patent publication no. GB-A-2341287) employing a global decoder in the first pipeline stage and local decoders in the second pipeline stage.

As described above with reference to FIG. 5, in clock cycle i+1 the falling edge C of the on-chip clock CK causes the latch circuitry 150 to latch the thermometer-coded signals T(i) generated by the decoder circuitry 140, and a short time d3 later the clocked thermometer-coded signals TCK(i) are available at the output of the latch circuitry 150. This delay d3 is caused by the delay in operation of the gates within the latch circuitry described above with reference to FIG. 5. A short time d4 after the new clocked thermometer-coded signals TCK1–TCKn are available at the input to the switch driver circuitry 160, the new analog output signal OUT is output from the switch circuitry 170. This delay d4 is caused by the delay in operation of the switch drivers $95_1$ and $95_2$ in the switch driver circuitry 160 and switches S1 and S2 in the switch circuitry 170 described above with reference to FIG. 6.

In the DAC 100 described above with reference to FIGS. 3 to 7, there are therefore several signal processing circuitry portions which have an influence on the total clock-to-sample (CTS) delay. In the present embodiment, these signal processing portions are: (a) the clock input circuitry 120 and the clock distribution circuitry 130, which together contribute a delay d2 to the CTS delay; (b) the latch circuitry 150 which contributes a delay d3 to the CTS delay; and (c) the switch driver circuitry 160 and the switch circuitry 170, which together contribute a delay d4 to the CTS delay. Thus the total CTS delay time is d2+d3+d4, assuming a fixed duty cycle CLK and/or CK signal so that the delay of 1½ clock cycles from the start of cycle i to the falling edge of clock signal CLK which corresponds to edge C can be discounted since it is a fixed delay and does not therefore contribute to any jitter.

However, depending on the techniques used to generate them, the CLK and/or CK clock signals may not in practice have a fixed duty cycle (e.g. 50%), so that the delay d2 may exhibit greater variation from cycle to cycle. Because of this, it is preferable that the latch circuitry 150 is clocked only on the rising edges of the clock signal CLK (or a clock signal derived therefrom such as CK). In addition, although in the FIG. 7 timing chart the falling edges of clock signal CK conveniently occur at times when valid and stable thermometer-coded signals are present at the output of the decoder circuitry 140, this cannot be guaranteed for all designs of decoder circuitry and for all clock frequencies.

Figure 8A:
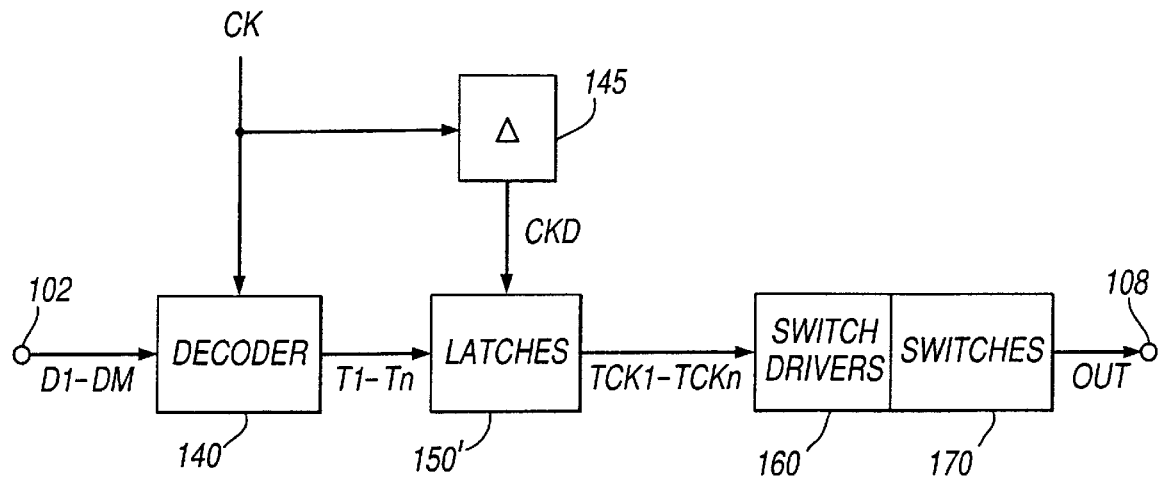
FIG. 8A shows parts of a DAC embodying the present invention having a delay element for supplying the latch circuitry with a delayed clock.
Figure 8B:
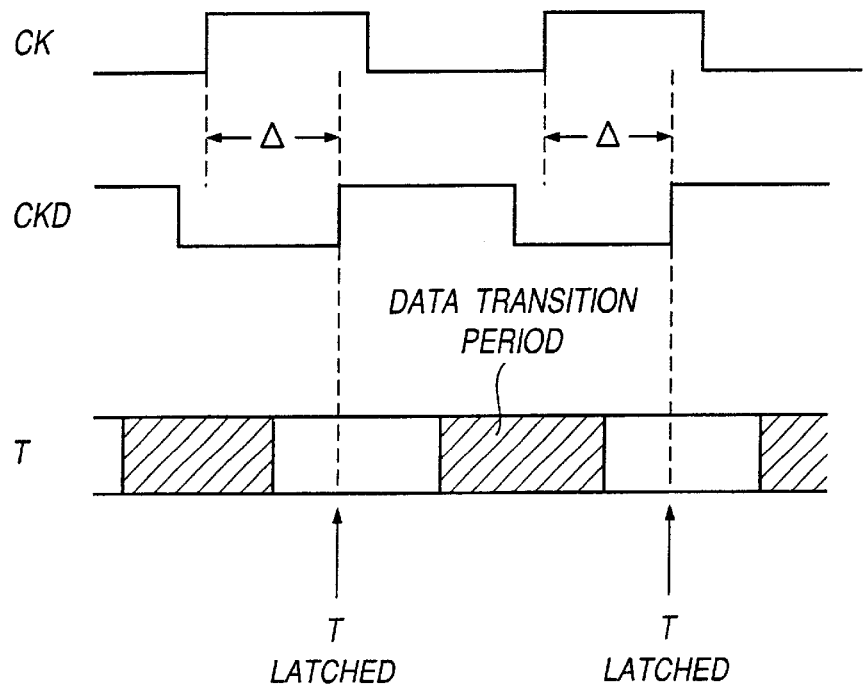
FIG. 8B is a timing diagram for use in illustrating operation of the circuitry of FIG. 8A.

An alternative arrangement for clocking the latches will now be described with reference to FIGS. 8A and 8B. In FIG. 8A, elements which correspond to elements described previously with reference to FIG. 3 are denoted by the same reference numerals as in FIG. 3. The latch circuitry 150' of FIG. 8A is a slight modification of the latch circuitry 150 of FIG. 3 as will be explained below. In the FIG. 8A arrangement, there is also provided a delay element 145 which receives the on-chip clock signal CK and delays the received clock signal CK by a predetermined amount $\Delta$ to produce a delayed clock signal CKD, as illustrated in FIG. 8B. The rising edges of this delayed clock signal CKD are used to latch the thermometer-coded signals T instead of the falling edges of the basic clock signal CK itself as described with reference to the timing chart of FIG. 7. The delay $\Delta$ introduced by the delay element 145 can be set such that the required set-up and hold times of the latch circuitry 150' are met, thus ensuring consistent and reliable latching of the thermometer-coded signals T1–Tn.

In FIGS. 8A and 8B the latch circuitry 150' is required to latch the thermometer-coded signals T1–Tn on the rising edges of the received clock, instead of on the falling edges of the received clock as in the FIG. 5 latch circuitry.

However, although the latch circuitry in FIG. 8A has the advantage of being clocked by the rising edges of the (delayed) on-chip clock CK, rather than the falling edges of CK as described above with reference to FIG. 7, it has the disadvantage that, because the delayed clock signal CKD for latch circuitry 150' is produced by delaying the CK signal, in this case undesirable jitter is still introduced into the TCK signals by the latch circuitry 150'. This jitter arises because the delay time $\Delta$ is not constant but varies in accordance with power supply fluctuations, noise and parasitic signals generated elsewhere in the circuitry, etc. The amount of jitter is essentially proportional to the magnitude of the delay time $\Delta$ which is, in turn, determined by the propagation times of the decoder circuitry 140. Since $\Delta$ may be as large as several hundred picoseconds, the resulting jitter may be as large as 30 picoseconds.

Figure 9A:
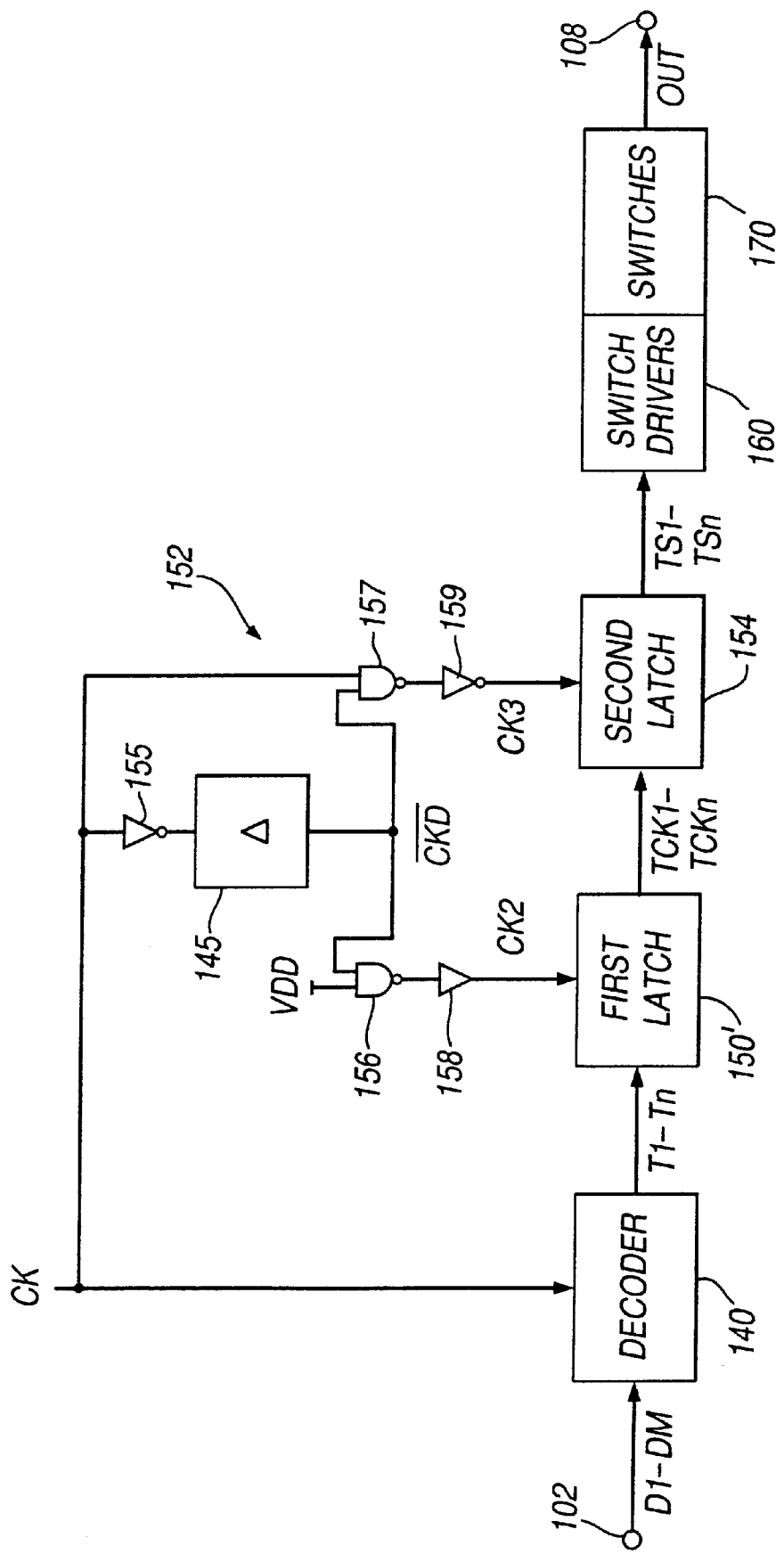
FIG. 9A shows parts of a DAC embodying the present invention having two stages of latch circuitry.

One possible solution to this problem is to provide two stages of latch circuitry as shown in FIG. 9A. In FIG. 9A, elements which correspond to elements described previously with reference to FIG. 8A and FIG. 3 are denoted by the same reference numerals as in FIG. 8A and FIG. 3. The FIG. 9A circuitry comprises first latch circuitry 150' which corresponds to the latch circuitry 150' of the FIG. 8A circuitry. The first latch circuitry 150' in this embodiment has a clock input for receiving clock signal CK2. Clocked thermometer-signals TCK are delivered at the outputs of the first latch circuitry 150', as in the FIG. 8A circuitry.

The FIG. 9A circuitry also has second latch circuitry 154 which preferably comprises a set of transparent half latches (although full edge-triggered latches could be used instead). The second latch circuitry 154 has an input connected to the output of the first latch circuitry 150' for receiving the clocked thermometer signals TCK therefrom.

The second latch circuitry 154 also has a clock input which is connected for receiving clock signal CK3. Thermometer signals TS for application to the switch driver circuitry 160 are delivered at the output of the second latch circuitry 154. The second latch circuitry 154 is transparent when the clock signal CK3 is at the high (H) logic level.

The FIG. 9A circuitry further comprises clock generating circuitry 152 for generating the clock signals CK2 and CK3. The clock generating circuitry 152 includes the delay element 145 of the FIG. 8A circuitry. The clock generating circuitry 152 further includes a first inverter 155, respective first and second NAND gates 156 and 157 and respective first and second buffers 158 and 159. The second buffer 159 is an inverting buffer.

The delay element 145 receives the clock signal CK signal via the first inverter 155. Thus, at the output of the delay element 145 a delayed clock signal $\overline{CKD}$ is produced that is inverted and delayed by the delay time $\Delta$ relative to the clock signal CK. This delayed clock signal $\overline{CKD}$ is delivered to one input of each of the NAND gates 156 and 157. The other input of the first NAND gate 156 is tied permanently to the high logic level H. The output of the first NAND gate 156 is received by the first buffer 158 which buffers the output to produce the CK2 signal.

The second input of the second NAND gate 157 is connected to receive the CK signal. The output of the second NAND gate 157 is received by the second driver 159 which produces the CK3 signal by inverting that output.

Operation of the FIG. 9A circuitry will now be described with reference to FIG. 9B. The first latch circuitry 150' is triggered at the rising edge of the CK2 signal in each cycle. Because the second input of the first NAND gate 156 is tied permanently to the H level, that gate simply functions as an inverter, so that CK2 is an inverted version of the $\overline{CKD}$ signal. Thus, referring back to FIG. 8A, the CK2 signal simply corresponds to the CKD signal in the FIG. 8A circuitry. Thus, as in the FIG. 8A circuitry, the outputs TCK of the first latch circuitry 150' do not change until a time $\Delta$ after the start of the next cycle after the cycle in which the new input word was accepted.

The second latch circuitry 154 is controlled by the clock signal CK3 applied thereto by the second driver 159. The CK3 signal becomes H when the CK and $\overline{CKD}$ signals are both high simultaneously. This occurs for the period A at the beginning of each cycle. Accordingly, the second latch circuitry 154 is transparent for this period $\Delta$ at the start of each cycle, and is in the non-transparent (holding) state for the remainder of the cycle.

Figure 9B:
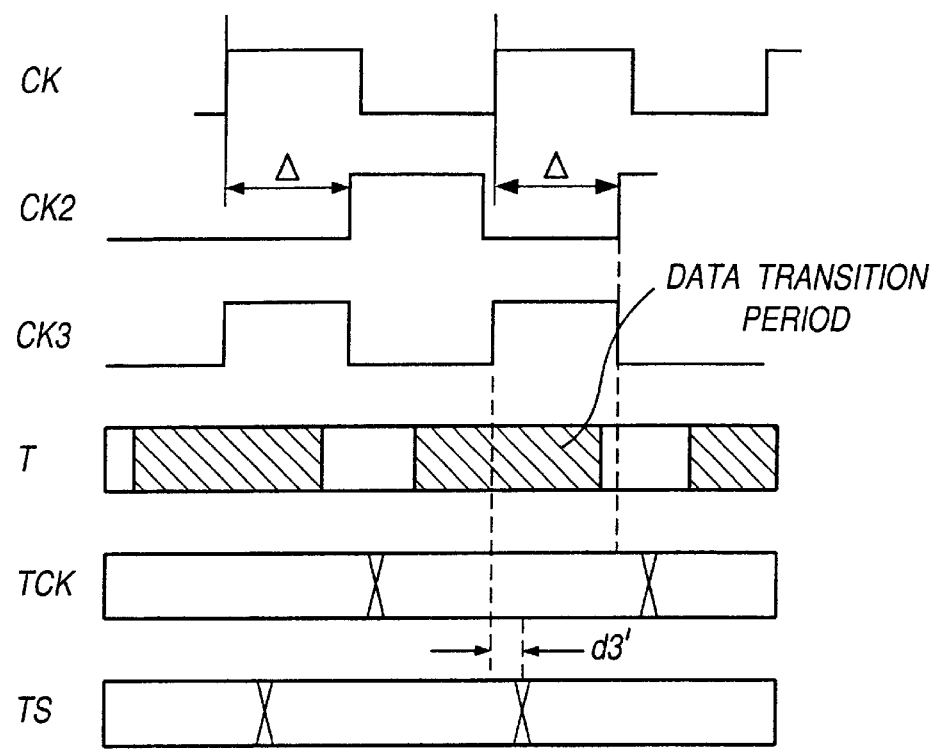
FIG. 9B is a timing diagram for use in illustrating operation of the circuitry of FIG. 9A.

As is apparent from FIG. 9B, the second latch circuitry 154 is no longer transparent in each cycle by the time that the output TCK of the first latch circuitry 150' undergoes its transition. Accordingly, these transitions are not registered by the second latch circuitry 154 until the beginning of the following cycle when CK3 rises.

In the FIG. 9A circuitry, the output TCK of the first latch circuitry 150' is subject to jitter arising from operation of the delay element 145 in exactly the same way as in the FIG. 8A circuitry. However, this jitter does not affect the output TS of the second latch circuitry 154, for reasons that will now be explained. The second latch circuitry 154 becomes transparent on the rising edge of the CK3 signal. The time that this signal rises is determined not by the operation of the delay element 145 but by the rise of the CK signal. Only the time at which the CK3 signal falls is determined by the delayed clock signal $\overline{\text{CKD}}$ produced by the delay element 145. It therefore follows that there is much less jitter on the rising edge of CK3.

There is jitter on the rising edge of CK2 and this inevitably produces jitter in the input signal TCK of the second latch circuitry 154. However, this jitter is of no consequence because the second latch circuitry 154 is placed in the holding state before the signal TCK undergo its transition. Thus, the jitter in these signals does not feed through to the TS signal. By the time the second latch circuitry 154 is made transparent again (at the beginning of the next cycle) the TCK signals have settled and so are stable at the moment the second latch circuitry 154 is made transparent. No jitter occurs at this time because the TCK signals are fixed whilst CK2 remains low.

Thus, compared with the FIG. 8A circuitry, it can be seen that the same speed performance is obtained by the FIG. 9A circuitry but with a jitter performance as good as if the delay element 145 were not present at all. Further details, including an example construction of the second latch circuitry 154, are disclosed in the assignee's co-pending U.S. patent application Ser. No. 09/382459 (corresponding to United Kingdom patent publication no. GB-A-2341287), the entire content of which is herein incorporated by reference. The FIGS. 9A and 9B circuitry still involves an unavoidable delay d3' arising from operation of the second latch circuitry 154 (although the delay d3' is less than the delay d3 in FIG. 7 as the latches in the second latch circuitry can be transparent (half) latches which are faster than full latches). The elements 157 and 159 (clock gating circuitry) also contribute to the delay d3'. Also, the delays d1 and d4 are still unavoidably present, so that there is an overall CTS delay of d1+d3'+d4.

Each of the delays d2, d3, and d4 in FIG. 7 (or each of the delays d1, d3' and d4 in the case of the FIGS. 9A and 9B circuitry) is dependent upon the supply voltages used to power the circuitry portion concerned. When the power supply to any one circuitry portion that contributes to the CTS delay is shared with any other circuitry portion (even if that other circuitry portion does not itself contribute to the CTS delay) it follows inevitably that the CTS delay will be affected by any variation in the power supply voltage that occurs, for example a variation caused by operation (especially high-speed switching) of the other circuitry portion.

This problem is exacerbated further when (as in the FIGS. 3 and 9A examples) there are two or more circuitry portions each of which contributes to the CTS delay. When any one of these delay-contributing circuitry portions shares its power supply with any other circuitry portion there is scope for the CTS delay to vary. Furthermore, when any two or more delay-contributing circuitry portions share the same power supply any power supply variation caused by operation of one delay-contributing circuitry portion will inevitably feed through to each further delay-contributing circuitry portion sharing its power supply, giving rise to serious "knock-on" effects in terms of CTS delay variation.

These considerations are particularly serious when, as in the above examples, some of the circuitry portions are segmented but the different segments within each circuitry portion share the same power supply.

Any CTS delay variation from one cycle to the next causes jitter in the analog output signal. Various measures have been considered previously for reducing jitter, as described below, but none of these measures has been found to be entirely effective to meet the most demanding jitter performance requirements.

A first measure is to try to reduce the overall magnitude of the CTS delay and/or the number of circuitry portions that contribute to it, as described above with reference to FIGS. 9A and 9B. As noted above the extent to which this measure can eliminate jitter is inherently limited.

The second measure that has been tried is to power the latch circuitry from a separate external power source from the power source(s) used to power the remaining parts of the IC. Further, by adopting a triple well construction, the latch circuitry may be formed in its own well, separate physically from wells in which the remaining parts of the circuitry are formed, to improve the isolation of the supply to the latch circuitry. For example, in GB-A-2341287 parts of the second latch are powered by an external (off-chip) power source that is separate from the power source for the first latch and the decoder circuitry. However, the clock distribution circuitry shares the same power source as the second latch so that there are at least two delay-contributing circuitry portions sharing the same power supply. Also, some parts of the second latch are powered from the same external power source as the first latch and the decoder circuitry, which have a high number of gates and accordingly produce relatively large variations in the potential of the power supply to those parts of the second latch.

A significant disadvantage of the second measure is the proliferation in power supply terminals required by the IC. A high number of power supply terminals limits the number of terminals available for other purposes, as well as possibly requiring an increase in the physical size of the IC package. Also, the different power supplies are all typically derived from the same external power source, and to keep the different supplies delivered to the IC's terminals separate complicated printed circuit board designs are required, for example involving bulky decoupling components, ground planes or other inconvenient and expensive measures.

In a mixed-signal IC embodying the present invention, the jitter problem is alleviated, without suffering the disadvantages of the previously-considered measures, by providing at least one of the signal processing circuitry portions which contributes to the CTS delay with its own on-chip supply voltage regulator to regulate inside the chip the voltage supplied thereto.

Consequently, in the present embodiment a first internal power supply voltage regulator $110_A$ is provided to regulate the supply to the clock distribution circuitry 130, a second internal power supply voltage regulator $110_B$ is provided to regulate the supply to the latch circuitry 150, and a third internal power supply voltage regulator $110_C$ is provided to regulate the supply to the switch driver circuitry 160.

In this way, the delays (d2, d3 and d4 in FIG. 7 or d1, d3' and d4 in the FIGS. 9A and 9B circuitry) contributed by the clock distribution circuitry 130, latch circuitry 150 (or 150') and switch driver circuitry 160 are affected significantly less by power supply variations, giving a significantly improved jitter performance.

In the FIG. 3 embodiment the clock input circuitry 120 and switch circuitry 170 could also each be provided with their own separate internal regulators to further improve the jitter performance. Depending on the way in which the decoding results are used it may also be advantageous to provide the decoder circuitry 140 with its own separate internal regulator too. For example, if there is no distinct latch circuitry 150 between the decoder circuitry 140 and the switch drivers 160, and instead the decoder circuitry has latched outputs in its own right the decoder circuitry 140 (or at least its output latches) would benefit from its own separate internal regulator.

In the FIG. 9A example, since the gates 157 and 159 (clock gating circuitry) contribute to the overall CTS delay time, those parts could together be provided with their own separate internal regulator to further improve the jitter performance.

Incidentally, it has been previously considered to provide internal (i.e. on-chip) power supply regulation for circuits which are required to provide a very stable voltage (for example, pre-regulation for voltage references), or for circuits which amplify small signals with high signal-to-noise ratio (SNR) (for example, low-noise audio/RF pre-amplifiers), or for circuits which use poorly-regulated or noisy supplies (for example, audio/RF power amplifiers). It has not, however, been previously considered to apply such internal power supply regulation to the clock/switching paths of high-speed mixed signal circuitry such as data converters (for example, digital-to-analog and analog-to-digital converters), either because they are generally not so sensitive to supply voltage (for example, ECL) and/or because of lower performance requirements (for example, in certain CMOS devices).

Figure 10A:
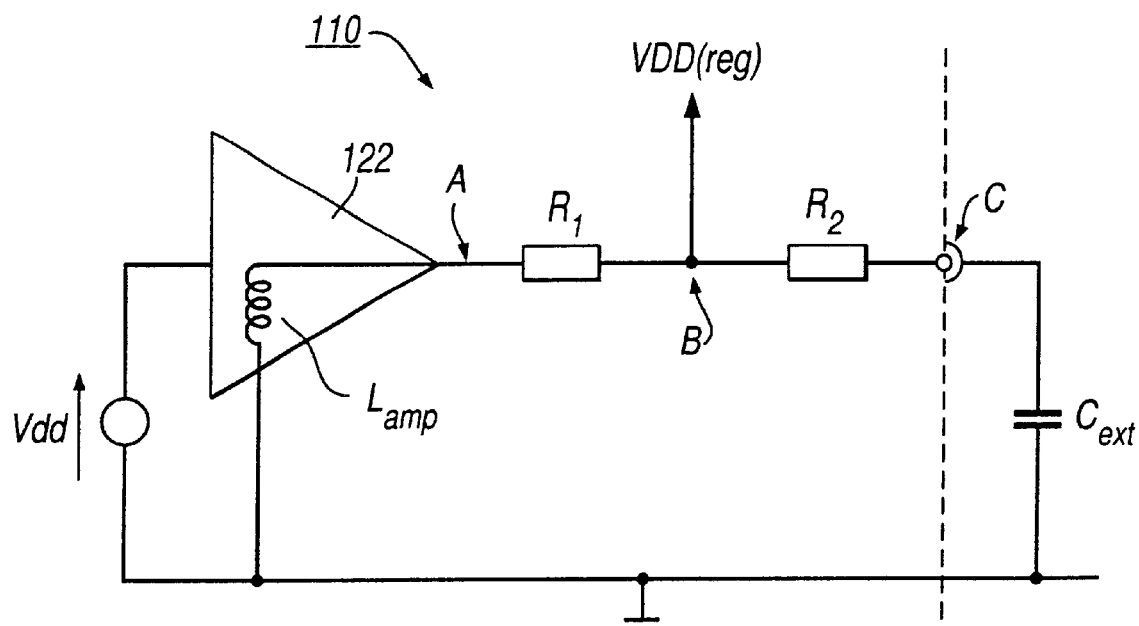
FIG. 10A shows an example construction of an internal power supply regulator for use in an embodiment of the present invention.

FIG. 10A shows one example of the internal power supply voltage regulators 110 in one embodiment of the present invention. The regulator 110 is divided into two parts as shown by the dotted line in FIG. 10A. The parts to the left of the dotted line are included in the integrated circuit device 100 (on-chip). The parts to the right of the dotted line are external of the integrated circuit device 100 (off-chip).

A basic regulated voltage Vdd is first derived from the unregulated external supply voltage VDD, and this basic regulated voltage is then buffered and further regulated if necessary to produce at an output node B of the regulator a regulated internal supply voltage VDD(reg) having a desired current driving capability. The basic regulated voltage is shown schematically in FIG. 10A as a voltage source. In practice it may be derived, for example, in known manner from a reverse-biased Zener diode, or more preferably from a bandgap reference circuit having a good rejection of power supply noise, or even from an external precision reference. The buffering circuitry 122 may include an operational amplifier.

An output impedance of the buffering circuitry 122 typically appears to be inductive, as the gain of the buffering circuit 122 generally falls off with increasing frequency. As shown in FIG. 10A, the output impedance can be modelled to a reasonable approximation as a fixed inductance $L_{amp}$. In practice, the actual inductance will not be fixed, but may vary in dependence upon such factors as output current (since the transconductance of an operational amplifier changes with current) and temperature.

In the FIG. 10A circuitry, a first resistor $R_1$ is connected in series between a node A at the output of the buffering circuitry 122 and the output node B (load node) at which the regulated power supply voltage VDD (reg) is output from the regulator. A second resistor $R_2$ is connected in series between the node B and a node C which is a connection terminal of the IC. An external capacitor $C_{ext}$ is connected in series between the node C and a ground line GND.

The regulated power supply voltage VDD (reg) of the voltage regulator is then fed to the signal processing circuitry which is being regulated by that regulator by connecting that circuitry to the node B of the regulator. Referring to FIG. 3, the clock distribution circuitry 130 is connected to node B of the first regulator $110_A$, the latch circuitry 150 is connected to node B of the second regulator $110_B$ and the switch driver circuitry 160 is connected to node B of the third regulator $110_C$.

The magnitude Z of the impedance which is seen by the signal processing circuitry connected to node B in FIG. 10A can be shown to be given by:

$$Z = \left\{ \left[ \frac{R_1 R_2 (R_1 + R_2) + \omega^2 L^2 R_2 + \frac{R_1}{\omega^2 C^2}}{(R_1 + R_2)^2 + \left(\omega L - \frac{1}{\omega C}\right)^2} \right]^2 + \left[ \frac{\omega L R_2^2 - \frac{R_1^2}{\omega C} - \frac{L}{C}\left(\omega L - \frac{1}{\omega C}\right)}{(R_1 + R_2)^2 + \left(\omega L - \frac{1}{\omega C}\right)^2} \right]^2 \right\}^{\frac{1}{2}}$$

Figure 10B:
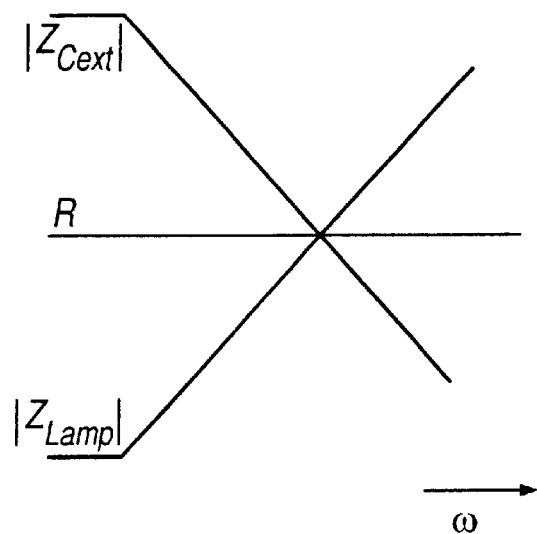
FIG. 10B shows a graph for illustrating impedance variation of components of the FIG. 10A regulator.

FIG. 10B shows schematically to a logarithmic scale the variation with frequency ω of the magnitude $|Z_C|$ of the impedance $Z_C$ of the capacitor $C_{ext}$ and the magnitude $|Z_L|$ of the impedance $Z_L$ of the inductance $L_{amp}$. As $|Z_C|$ falls with increasing frequency and $|Z_L|$ rises with increasing frequency, at some frequency $\omega_x$ the magnitudes of the two impedances cross over so that both have an impedance of $Z_x$.

It can be shown that, in the circuitry of FIG. 10A, by setting $R_1 = R_2 = R$ and further setting R to be equal to the cross-over impedance $Z_x$ of L and C, the magnitude of the impedance Z seen at node B of FIG. 10A reduces to:

$$Z = \sqrt{\frac{L}{C}}$$

With the configuration shown in FIG. 10A, therefore, the node B appears to the signal processing circuitry concerned to have a constant impedance which is purely resistive and is independent of frequency ω. In practice, of course, the output impedance of the amplifier in the power supply regulating circuitry 20 will not be precisely modelled by a fixed inductance $L_{amp}$ and there will be departures from ideal behaviour in other respects too, so the node-B impedance will not be completely resistive and independent of frequency.

The resistors $R_1$ and $R_2$ effectively act as damping resistors in an LC resonator circuit made up of those resistors and the inductance $L_{amp}$ and the capacitor $C_{ext}$. The above-described constant impedance situation occurs when the values of $R_1$ and $R_2$ are set to give critical damping for the LC resonator circuit. In practice it is not usually possible reliably to design the circuitry to be critically damped, for example due to component tolerances and non-ideal behaviour of the operational amplifier. It is therefore preferable to set the values of $R_1$ and $R_2$ to give slight over-damping (e.g. a nominal quality factor Q in the range from 0.3 to 0.7), so that, allowing for component tolerances and other factors, under-damping does not occur.

Based on simulations and/or actual measurements, in one embodiment of the invention $L_{amp}$ is approximately 1 $\mu$H. The capacitor $C_{ext}$ can be set to any arbitrary value, although it is preferably within the range from 10 nF to 1 $\mu$F. If $C_{ext}$ is below 10 nF the output impedance Z will be too large, and if C is greater than 1 $\mu$F the capacitor will be too bulky and expensive. In one embodiment, a capacitor C of 0.1 $\mu$F is used. In this case the cross-over impedance, and therefore the value of the resistance R, is 3.16 Ω. To design for slight over-damping, a resistance value R of, for example, 3.5 Ω can be used.

In the FIG. 10A circuitry, to obtain a desirably low output impedance Z (e.g. a few ohms), the capacitor needs to be quite large, and so is placed off-chip. The external capacitor for each internal regulator is connected to the corresponding connection terminal (node C) of the IC. These corresponding connection terminals are labelled as 109A to 109C in FIG. 3.

Further modifications and improvements which can be made to the supply voltage regulating circuitry described with reference to FIGS. 10A and 10B can be found in the assignee's U.S. Pat. No. 6,329,870 (corresponding to United Kingdom patent publication no. GB-A-2356267), the entire contents of which are herein incorporated by reference.

It will be appreciated that the on-chip power supply regulators do not have to be of the type described above with reference to FIGS. 10A and 10B, but this may be advantageous in view of the low and frequency-independent output impedance provided by such a regulator. It is necessary to have a higher voltage available on-chip from which these regulators can regulate down, but this will often be the case anyway. For example, "precision analog" circuits use 3.3V but "high-speed switching" circuits use 2.5V or 1.8V.

It will also be appreciated that it is not essential that every signal processing circuitry portion which contributes to the CTS delay is provided with its own internal supply voltage regulator. For example, in the FIG. 3 embodiment the clock input circuitry 120 is not provided with such a supply voltage regulator. An advantage will be achieved even if only one such signal processing circuitry portion is provided with its own internal supply voltage regulator.

Figure 11:
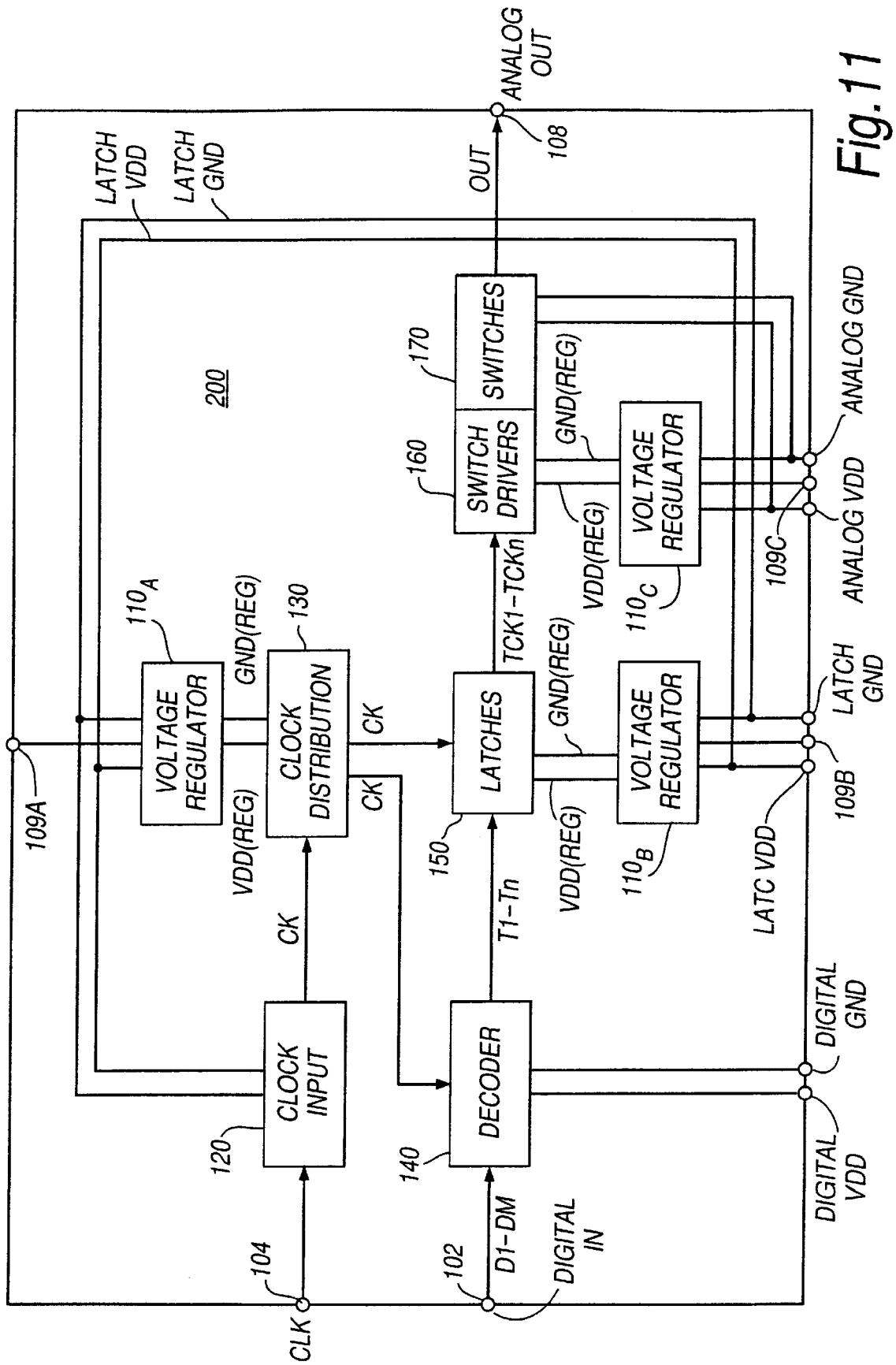
FIG. 11 is a block diagram showing parts of another mixed-signal integrated circuit device (DAC) embodying the present invention.

As mentioned above, it has been previously proposed to achieve a further improved jitter performance by providing separate supply voltages to power various circuitry portions, for example separate supplies for the digital, latch, analog and clock distribution portions. Internal supply voltage regulators are still advantageous in this situation. For example, in another embodiment of the invention shown in FIG. 11, three separate external power sources are used: (a) DIGITAL GND/VDD to power the decoder circuitry 140; (b) LATCH GND/VDD to power the latch circuitry 150, the clock distribution circuitry 130 and the clock input circuitry 120; and (c) ANALOG GND/VDD to power the switch driver circuitry 160 and switch circuitry 170. The internal voltage regulators $110_A$ and $110_B$ are connected to receive the external power source voltages LATCH GND/VDD, whereas the internal voltage regulator $110_C$ is connected to receive the external power source voltages ANALOG GND/VDD.

It will be appreciated that the signal processing circuitry portions which may benefit from the provision of separate on-chip supply voltages regulators are not limited to those described above with reference to FIGS. 3 to 11. For example clock driver circuitry, clock gating circuitry (e.g. gates 157 and 159 in FIG. 9A), and any other circuit in the clock to sample path whose delay is a function of supply voltage (e.g. most CMOS circuits) can be provided with its own on-chip regulator.

Separate regulators for different circuits are also useful to reduce supply-induced crosstalk. For example, if the output signal of a high-speed DAC affects the supply voltage (or equivalently, the delay) of its own clock path, this causes harmonic and intermodulation distortion. In this case the clock input/buffers/distribution and DAC would preferably use separate power supply regulators.

This may happen even if the DAC supply current is constant, since the DAC output may not be balanced and there may be coupling between the output and the power supply via any protection diodes or other parasitic capacitances (for example, a protection circuit using entirely PMOS transistors has an inevitable parasitic capacitance to VDD). Where two DAC circuits are included on the same integrated circuit device there may also be crosstalk between the two DACs which can degrade the SFDR, so each DAC circuit would benefit from having its own power supply regulator. With such an integrated circuit device having two DACs, any clock processing circuitry provided in common to the two DACs would also benefit from having its own power supply regulator in addition to any separate regulators provided for the clock processing circuitry (e.g. clock input and/or clock distribution circuitry portions) contained within the DACs themselves.

The above embodiments have been described in relation to a digital-to-analog converter (DAC) integrated circuit device. In a DAC, jitter in the CTS delay (delay error) has the effect of introducing an amplitude error in the analog output signal. Such amplitude errors, which result in distortion in the output signal, will of course only occur if the input (and therefore output) signal is changing, the error due to jitter being generally proportional to the frequency (or equivalently the slew rate) of the changing signal.

Similar considerations also apply to analog-to-digital converters (ADCs), where jitter in the CTS delay can also have a corresponding amplitude-error effect because, for example, sampling an analog input signal too early or too late will result in the sampled analog input signal having an amplitude error which inevitably feeds through to the digital output signal.

Figure 12:
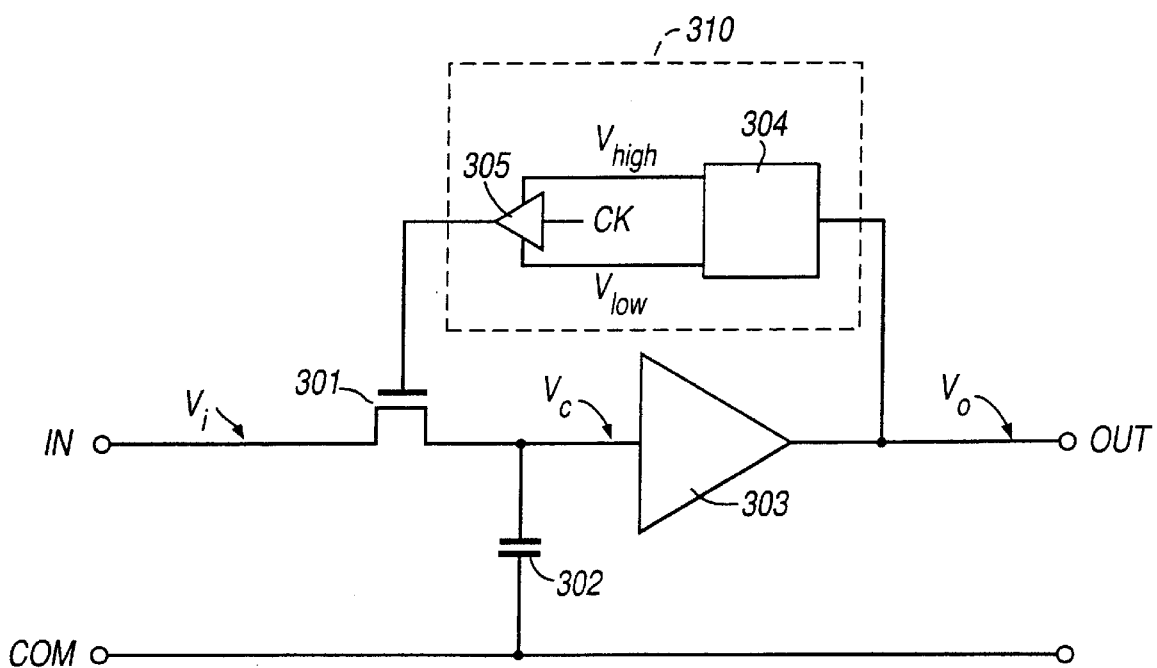
FIG. 12 shows parts of another mixed-signal integrated circuit device (ADC) embodying the present invention.

FIG. 12 shows parts of a voltage storage circuit (sample-and-hold circuit) which can be used in an analog-to-digital converter (ADC). The voltage storage circuit includes an input switch element 301 connected between an input node IN of the circuit and a first plate of a storage capacitor 302. The other plate of the capacitor 302 is connected to a common terminal COM of the circuit. A high-impedance amplifier element 303 is connected to the first plate for providing at an output node OUT of the circuit an output voltage $V_o$ dependent upon the first-plate potential $V_c$.

The voltage storage circuit further comprises a switch driver portion 310 including a bootstrap generator circuit 304 and a selector circuit 305. The bootstrap generator circuit 304 has an input connected to the output terminal of the amplifier element 303. The generator circuit 304 generates at respective outputs thereof potentials $V_{high}$ and $V_{low}$ ($V_{high}$>$V_{low}$) each of which has a constant offset from the output-terminal potential $V_o$. These two potentials are at suitable levels to apply to the gate electrode of the input switch element 301 in order to maintain it in its ON and OFF states.

The two potentials $V_{high}$ and $V_{low}$ are applied as inputs to the selector circuit 305 which also receives a clock signal CK. The output of the selector circuit 305 is connected to the gate electrode of the input switch element 301. The selector circuit 305 switches the gate electrode potential between the two potentials $V_{high}$ and $V_{low}$ in dependence upon the clock signal CK. The bootstrapped switch driving portion 310 has the advantage that the potential applied to the input switch element 301 to maintain it in the ON state is fixed relative to the input terminal potential $V_i$ so that the amount of charge injected by the element 301 when it is switched OFF is substantially constant irrespective of the input terminal potential. Because this charge injection is constant, it leads to a constant error in the stored voltage, which can be readily compensated for.

Further details of the design of the voltage storage circuit of FIG. 12 can be found in GB-A-2270431, the entire content of which is incorporated herein by reference.

The FIG. 12 voltage storage circuit may be employed in an ADC to sample and then hold an analog input signal which is to be converted into a corresponding digital signal. In this case, in each conversion cycle a new sample of the analog input signal is taken by changing the input switch element 301 from its ON (sampling) state to its OFF (holding) state. This change is initiated at a time determined by an externally-applied clock signal (timing signal). The on-chip clock signal CK applied to the selector circuit 305 is, for example, derived by a clock input circuitry portion (not shown but similar to the clock input circuitry portion 120 in FIG. 3) from the externally-applied clock signal CLK and distributed internally within the ADC by a clock distributing circuitry portion (not shown but similar to the clock distributing circuitry portion 130 in FIG. 3). Accordingly, the clock input circuitry portion, clock distributing circuitry portion, and switch driver portion 310 constitute delay-contributing portions in this case, each delay-contributing portion making a contribution to the overall CTS delay that is affected by variations in a power supply voltage applied to the delay-contributing portion concerned. For this reason, in an ADC embodying the present invention one or more, and preferably each, of these delay-contributing portions has its own internal supply voltage regulator for deriving from an external power source voltage a regulated internal power supply voltage which is applied to the delay-contributing portion concerned. The amplifier element 303 may also contribute to the CTS delay and may therefore also benefit from being provided with its own internal supply voltage regulator.

Two voltage storage circuits of the kind shown in FIG. 12 can be advantageously employed in each pipeline stage of a pipelined ADC, as also described in detail in GB-A-2270431. As each of the two voltage storage circuits per pipeline stage comprises a delay-contributing portion, it is preferable for each of the two voltage storage circuits in the same stage to have one or more internal supply voltage regulators of its own. Also, it is preferable that each stage has one or more internal supply voltage regulators of its own.

Accordingly, the present invention is advantageously applicable to ADCs as well.

It will be appreciated that the provision of separate on-chip supply voltage regulators is applicable to other types of integrated circuit device having signal processing circuitry portions where the delay in a signal path is critically dependent on the delay through those circuitry portions, and where that delay is dependent on the supply voltages provided to those circuitry portions. For example, the present invention is also applicable to digital mixers.

What is claimed is:

1. A mixed-signal integrated circuit device comprising:
a plurality of circuitry segments, each segment having a latch which receives a digital input signal and latches the signal at a time determined by an applied clock signal, and also having a switch driver circuit which receives an output signal of the latch and derives therefrom an analog drive signal, and also having a switch which receives said analog drive signal and is switched on or off thereby,
wherein each circuitry segment further comprises an individual supply voltage regulator connected to receive an external power source voltage and operable to derive therefrom a regulated internal power supply voltage which is applied to said switch driver circuit in the segment.

2. A mixed-signal integrated circuit device comprising:
signal processing circuitry operable to produce an output signal in dependence upon a received input signal, production of the output signal being initiated at a time determined by a timing signal and being completed at a time which is delayed by a delay time with respect to said timing signal, said signal processing circuitry comprising a plurality of delay-contributing portions, each of which makes a contribution to said delay time that is affected by variations in a power supply voltage applied to the delay-contributing portion concerned; and
a plurality of internal supply voltage regulators corresponding respectively to said plurality of delay-contributing portions, each connecting to, when the device is in use, a power source external of the device to receive therefrom an external power source voltage, and each operable to derive from the external power source voltage a regulated internal power supply voltage which is applied to said corresponding delay-contributing portion, at least one further circuitry portion within the device being powered by a supply voltage other than said regulated internal power supply voltage.

3. A device as claimed in claim 2, wherein each said internal supply voltage regulator serves exclusively to power one of said plurality of delay-contributing portions alone.

4. A device as claimed in claim 2, wherein the device is connected, when in use, to receive at least two different external power source voltages, and said at least two external power source voltages are used to power different respective circuitry portions of said signal processing circuitry.

5. A device as claimed in claim 4, comprising at least one said internal supply voltage regulator per external power source voltage to derive from the external power source voltage concerned a regulated internal power supply voltage which is applied to at least one of said plurality of delay-contributing portions.

6. A device as claimed in claim 4, wherein one of said at least two external power source voltages is used to power digital circuitry portions of said signal processing circuitry, and the or another one of said at least two external power source voltages is used to power analog circuitry portions of said signal processing circuitry.

7. A device as claimed in claim 2, wherein one of said plurality of delay-contributing portions is a clock input portion.

8. A device as claimed in claim 7, wherein said clock input portion is operable to receive said timing signal and to derive therefrom at least one internal clock signal for use by said signal processing circuitry.

9. A device as claimed in claim 2, wherein one of said plurality of delay-contributing portions is a clock distribution portion.

10. A device as claimed in claim 9, wherein said clock distribution portion is operable to distribute one or more clock signals derived from said timing signal within said signal processing circuitry.

11. A device as claimed in claim 2, wherein one of said plurality of delay-contributing portions is a latch portion.

12. A device as claimed in claim 11, wherein said latch portion is operable to latch a signal at a time determined by a clock signal to produce a clocked signal which is used in the production of said output signal.

13. A device as claimed in claim 2, wherein one of said plurality of delay-contributing portions is a switch driver portion.

14. A device as claimed in claim 13, wherein said switch driver portion is operable to receive a control signal and to produce a driving signal for application to a switch to open and close said switch in response to changes in the received control signal.

15. A device as claimed in claim 13, wherein said switch is opened and closed to change a sample-and-hold circuit between a sampling state and a holding state.

16. A device as claimed in claim 2, wherein one of said plurality of delay-contributing portions is an electronic switch portion.

17. A device as claimed in claim 16, wherein said electronic switch portion is used to switch the whole or part of said output signal.

18. A device as claimed in claim 2, wherein one of said plurality of delay-contributing portions is an analog amplifier portion.

19. A device as claimed in claim 2, wherein said input signal is a digital signal and said output signal is an analog signal.

20. A device as claimed in claim 2, wherein said input signal is an analog signal and said output signal is a digital signal.

21. A device as claimed in claim 2, wherein said signal processing circuitry operates repetitively to perform a series of processing cycles, and one such output signal is produced in each said processing cycle.

22. A device as claimed in claim 2, wherein at least one circuitry portion of said signal processing circuitry is divided into a plurality of circuitry segments which are operable in combination to produce said output signal in dependence upon said received input signal, and there is at least one said delay-contributing portion and a corresponding one of said internal supply voltage regulators per circuitry segment.

23. A device as claimed in claim 2, wherein at least one circuitry portion of said signal processing circuitry is divided into a series of pipeline stages which are operable in pipelined manner to produce said output signal in dependence upon said received input signal.

24. A device as claimed in claim 23, wherein at least one said pipeline stage comprises one or more said delay-contributing portions.

25. A device as claimed in claim 23, wherein each pipeline stage comprises one or more said delay-contributing portions.

26. A device as claimed in claim 2, wherein at least one of said plurality of internal supply voltage regulators has impedance variation reducing circuitry which reduces frequency-dependent variations in an output impedance thereof.

27. A device as claimed in claim 26, wherein the impedance variation reducing circuitry comprises:

a reference voltage amplifier having an input for receiving a regulated source voltage derived from said external power source voltage and also having an output whose impedance has an effective inductive component in a desired range of operating frequencies of the delay-contributing portion that is powered by said internal supply voltage regulator;

a first resistance element, having a preselected resistance, connected between said output of said amplifier and an output node of the regulator to which said delay-contributing portion is connected;

a connection terminal to which external capacitance having a preselected capacitance are connected when the device is in use; and a second resistance element, having a preselected resistance, connected between said output node and said connection terminal.

28. A device as claimed in claim 2, comprising two or more sets of said signal processing circuitry, wherein each said set of signal processing circuitry has a plurality of said internal supply voltage regulators, each applying a regulated internal power supply voltage to a corresponding delay-contributing portion in the set of signal processing circuitry concerned.

29. A device as claimed in claim 28, wherein each said set of signal processing circuitry comprises a digital-to-analog converter or an analog-to-digital convertor.

* * * * *